US009371982B2

(12) United States Patent
Zhou

(10) Patent No.: US 9,371,982 B2
(45) Date of Patent: Jun. 21, 2016

(54) GLASS BASED MULTICHIP PACKAGE

(71) Applicant: Maxim Integrated Products, Inc., San Jose, CA (US)

(72) Inventor: Tiao Zhou, Carrollton, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/136,556

(22) Filed: Dec. 20, 2013

(65) Prior Publication Data

US 2015/0049498 A1 Feb. 19, 2015

Related U.S. Application Data

(60) Provisional application No. 61/866,093, filed on Aug. 15, 2013.

(51) Int. Cl.
*H01L 29/22* (2006.01)
*F21V 21/00* (2006.01)
*B32B 17/00* (2006.01)
(Continued)

(52) U.S. Cl.
CPC .................. *F21V 21/00* (2013.01); *B32B 17/00* (2013.01); *H01L 21/4846* (2013.01); *H01L 23/13* (2013.01); *H01L 23/15* (2013.01); *H01L 23/5389* (2013.01); *H01L 25/167* (2013.01); *H01L 31/0203* (2013.01); *H01L 23/49816* (2013.01); *H01L 24/13* (2013.01); *H01L 24/16* (2013.01); *H01L 24/17* (2013.01); *H01L 24/29* (2013.01); *H01L 24/32* (2013.01); *H01L 27/14618* (2013.01); *H01L 2224/131* (2013.01); *H01L 2224/16145* (2013.01); *H01L 2224/16225* (2013.01); *H01L 2224/1703* (2013.01); *H01L 2224/17515* (2013.01); *H01L 2224/2919* (2013.01); *H01L 2224/831* (2013.01); *H01L 2924/12042* (2013.01)

(58) Field of Classification Search
CPC ....... H01L 23/13; H01L 25/165; H01L 23/15; H01L 25/167; H01L 21/00
USPC ...................... 257/701, 98, E25.032
See application file for complete search history.

(56) References Cited

U.S. PATENT DOCUMENTS 6,830,221 B1 * 12/2004 Janson ..................... B64G 1/10
244/158.1
7,274,101 B2 * 9/2007 Tomita et al. ................. 257/730
(Continued)

OTHER PUBLICATIONS

G. H. Beall, Design and Properties of Glass-Ceramics; Annual Reviews; 1992; pp. 1-30.
(Continued)

*Primary Examiner* — Nitin Parekh
(74) *Attorney, Agent, or Firm* — Advent, LLP

(57) ABSTRACT

In implementations, a glass-based multichip package includes a photodefinable glass-based substrate, at least one electronic component disposed on the photodefinable glass-based substrate, and a portion of the photodefinable glass-based substrate that has been exposed to ultraviolet light, where the portion of the photodefinable glass-based substrate includes ceramic. Additionally, the sensor package may include additional electronic components, a glass touch panel, and/or a printed circuit board. In implementations, fabricating the sensor package device includes receiving a photodefinable glass-based substrate, etching the photodefinable glass-based substrate, and forming a ceramic portion of the photodefinable glass-based substrate.

12 Claims, 11 Drawing Sheets

(51) Int. Cl.
*H01L 21/48* (2006.01)
*H01L 31/0203* (2014.01)
*H01L 23/13* (2006.01)
*H01L 23/15* (2006.01)
*H01L 23/538* (2006.01)
*H01L 25/16* (2006.01)
*H01L 23/498* (2006.01)
*H01L 23/00* (2006.01)
*H01L 27/146* (2006.01)

(56) References Cited

U.S. PATENT DOCUMENTS

| | | | | |
|---|---|---|---|---|
| 7,919,849 | B2* | 4/2011 | Kodama | G02B 6/4204 257/698 |
| 8,062,753 | B2* | 11/2011 | Schreder | B29D 11/00 428/221 |
| 8,709,702 | B2* | 4/2014 | Flemming | B81C 1/00 430/311 |
| 2003/0015284 | A1* | 1/2003 | Merdan et al. | 156/272.2 |
| 2005/0135724 | A1* | 6/2005 | Helvajian | B64G 1/10 385/14 |
| 2006/0022290 | A1* | 2/2006 | Chen | H01L 24/24 257/432 |
| 2006/0171033 | A1* | 8/2006 | Schreder et al. | 359/566 |
| 2008/0083980 | A1* | 4/2008 | Yang | H01L 27/14618 257/700 |
| 2008/0191333 | A1* | 8/2008 | Yang | H01L 21/6835 257/680 |
| 2010/0304061 | A1* | 12/2010 | Ye et al. | 428/34.4 |
| 2011/0111256 | A1* | 5/2011 | Hara | G02B 1/041 428/688 |

OTHER PUBLICATIONS

Roger Cook, Jeb Flemming; 3D Glass Solutions Overview; pp. 1-27. Processing APEX Glass; Life BioScience; 3D Glass Solutions; Updated Jan. 2, 2013; pp. 1-4.

Khalid H M Tantawi, Janeczka Oates, Reza Kamali-Sarvestani, Nathan Bergquist and John D Williams; Processing of photosensitive APEXtm glass structures with smooth and transparent sidewalls; J. Micromech. Microeng.; 21 (2011) 017001; pp. 1-6.

* cited by examiner

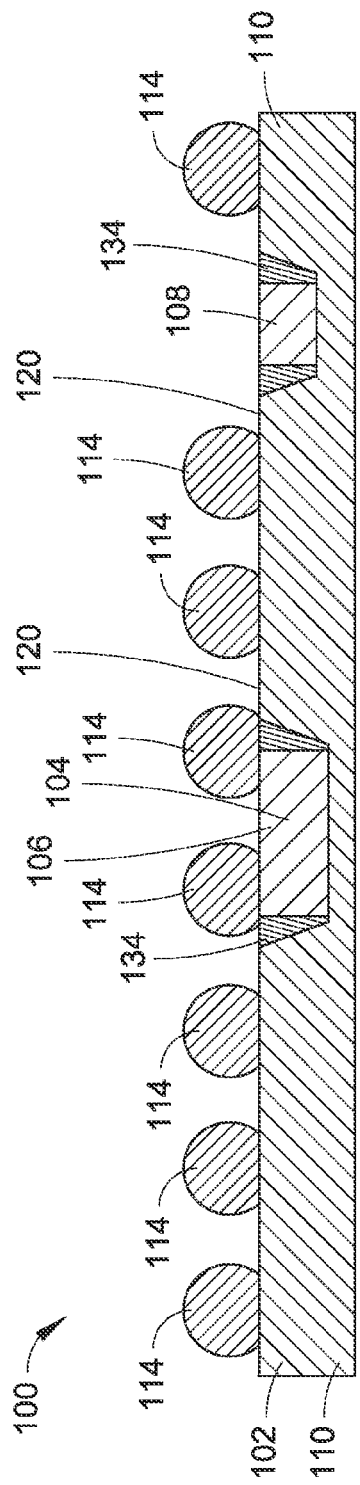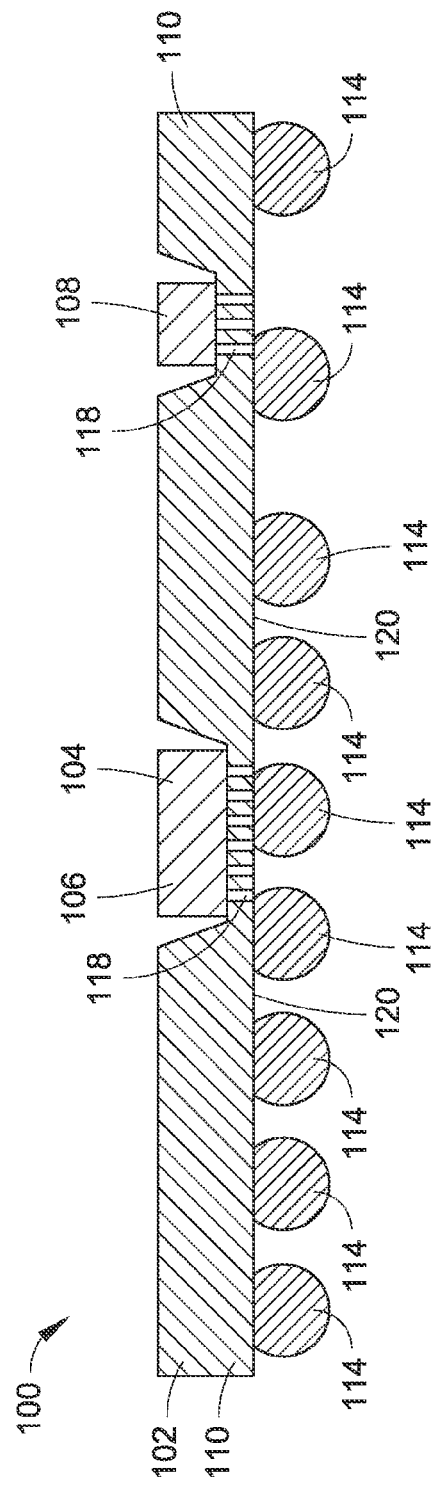

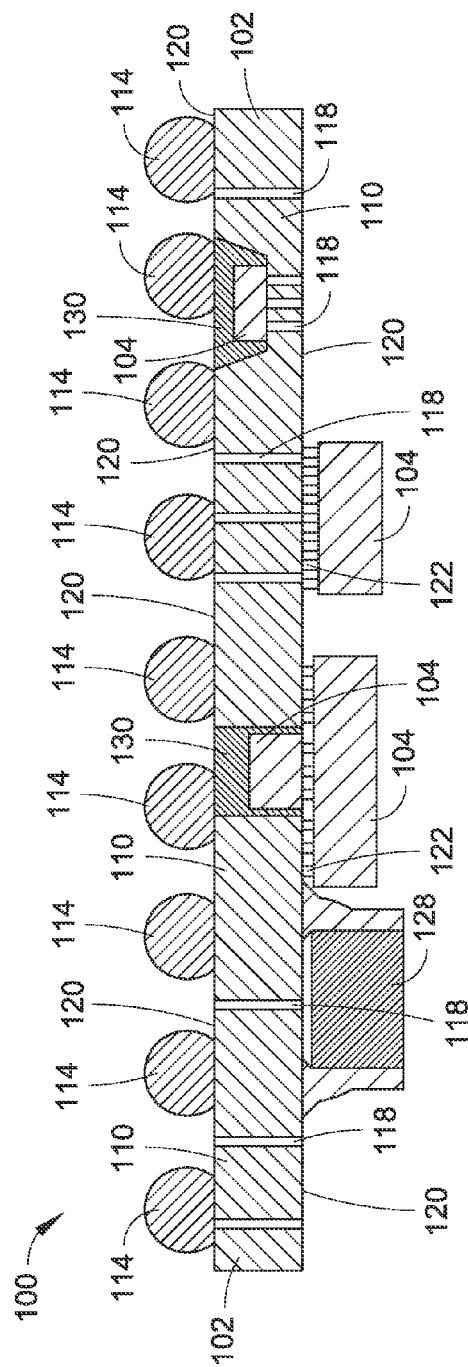
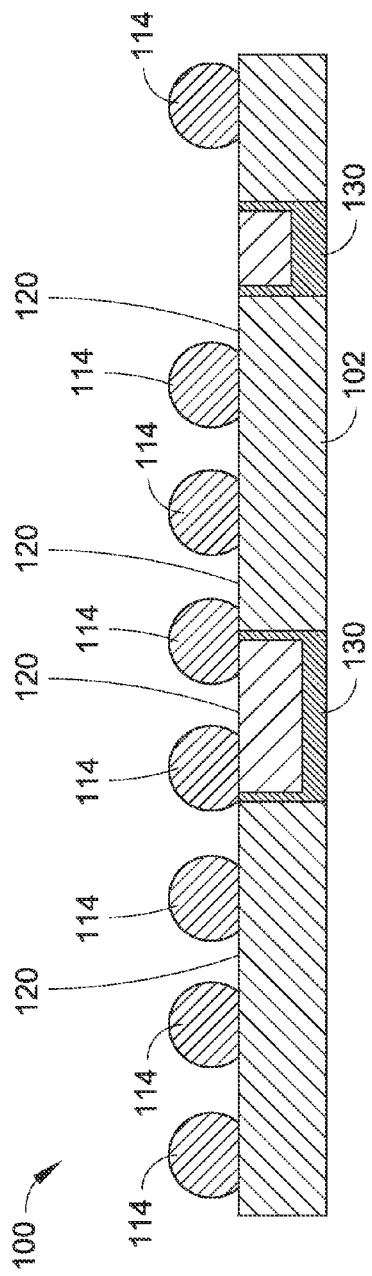
FIG. 1N
FIG. 1O

GLASS BASED MULTICHIP PACKAGE

CROSS-REFERENCE TO RELATED APPLICATIONS

The present application claims the benefit under 35 U.S.C. §119(e) of U.S. Provisional Application Ser. No. 61/866,093, filed Aug. 15, 2013, and titled "GLASS BASED MULTI-CHIP PACKAGE." U.S. Provisional Application Ser. No. 61/866,093 is herein incorporated by reference in its entirety.

BACKGROUND

Electronic devices, such as smart phones, tablet computers, digital media players, and so forth, increasingly employ sensors to control the manipulation of a variety of functions provided by the device. For example, optical sensors are commonly used by electronic devices to detect ambient lighting conditions in order to control the brightness of the device's display screen. Similarly, optical sensors are commonly used in proximity and gesture sensing applications. Proximity and gesture sensing enables the detection of physical movement (e.g., "gestures") without the user actually touching the device within which the sensing device resides. The detected movements can be subsequently used as input commands for the device.

SUMMARY

Packaging techniques are described for fabricating a glass-based multichip package that include one or more sensor or electronic devices, such as optical sensors or light sources, where the sensor and/or electronic device is disposed in and/or on a photodefinable glass-based substrate.

In implementations, the glass-based multichip package includes a photodefinable glass-based substrate, at least one electronic component disposed on the photodefinable glass-based substrate, and a portion of the photodefinable glass-based substrate that has been exposed to ultraviolet light, where the portion of the photodefinable glass-based substrate includes ceramic. Additionally, the sensor package may include additional electronic components, a glass touch panel, and/or a printed circuit board. In implementations, fabricating the sensor package device includes receiving a photodefinable glass-based substrate, etching the photodefinable glass-based substrate, and forming a ceramic portion of the photodefinable glass-based substrate.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

FIG. 1J is a diagrammatic partial cross-sectional side elevation view illustrating a glass-based multichip package in accordance with example implementations of the present disclosure.

FIG. 1K is a diagrammatic partial cross-sectional side elevation view illustrating a glass-based multichip package in accordance with example implementations of the present disclosure.

FIG. 1N is a diagrammatic partial cross-sectional side elevation view illustrating a glass-based multichip package in accordance with example implementations of the present disclosure.

FIG. 1O is a diagrammatic partial cross-sectional side elevation view illustrating a glass-based multichip package in accordance with example implementations of the present disclosure.

DETAILED DESCRIPTION

Overview

Current packaging solutions for sensors and other electronic components are very complex with complicated package constructions, significant tooling costs, and marginal reliability. Current methods and materials relating to sensor devices can be expensive and difficult to integrate into a typical electronic package construction without significantly increasing the complexity of the assembly process as well as a significant increase in tooling charges associated with the assembly technology. Additionally, many multichip optical sensor packages lack light isolation between sensors and/or electrical components Accordingly, packaging techniques are described for fabricating a glass-based multichip package that include one or more sensor or electronic devices, such as optical sensors or light sources, where the sensor and/or electronic device is disposed in and/or on a photodefinable glass-based substrate.

In implementations, a glass-based multichip package includes a photodefinable glass-based substrate, at least one electronic component disposed on the photodefinable glass-based substrate, and a portion of the photodefinable glass-based substrate that has been exposed to ultraviolet light, where the portion of the photodefinable glass-based substrate includes ceramic. Additionally, the sensor package may include additional electronic components, a glass touch panel, and/or a printed circuit board. In implementations, fabricating the sensor package device includes receiving a photodefinable glass-based substrate, etching the photodefinable glass-based substrate, and forming a ceramic portion of the photodefinable glass-based substrate.

Example Implementations

Figure 1A:
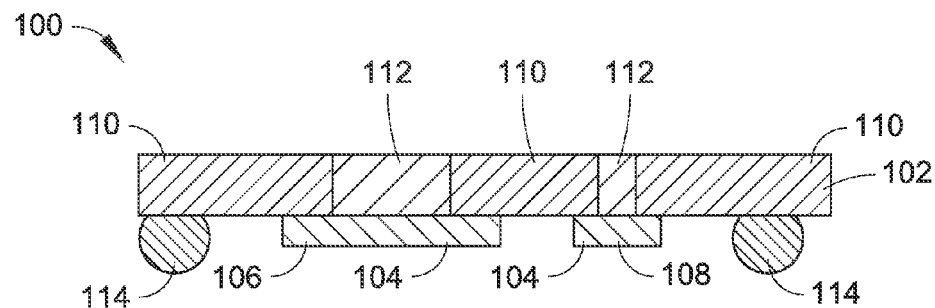
FIG. 1A is a diagrammatic partial cross-sectional side elevation view illustrating a glass-based multichip package in accordance with example implementations of the present disclosure.
Figure 1B:
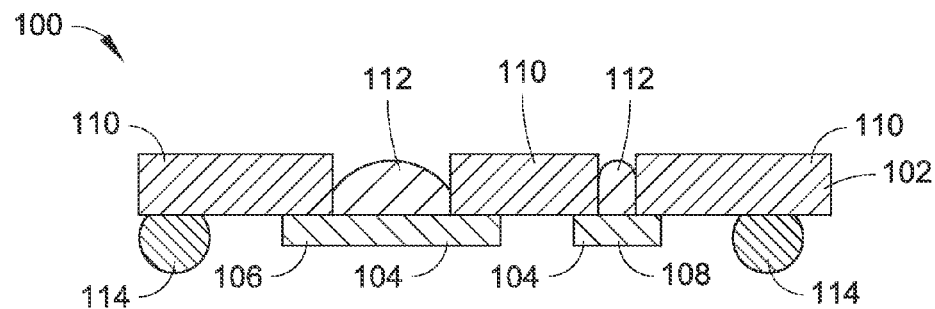
FIG. 1B is a diagrammatic partial cross-sectional side elevation view illustrating a glass-based multichip package in accordance with example implementations of the present disclosure.
Figure 1C:
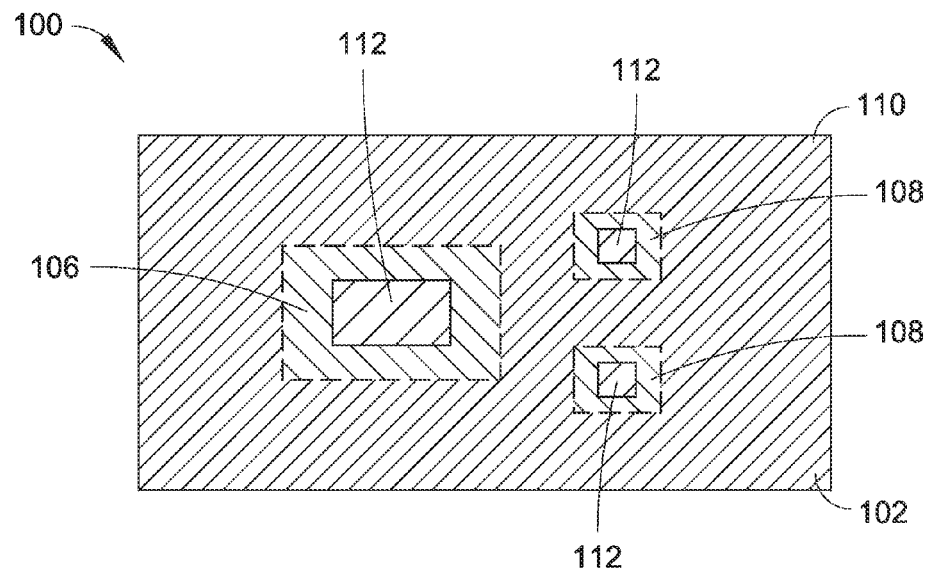
FIG. 1C is a top plan view illustrating a glass-based multichip package in accordance with example implementations of the present disclosure.
Figure 1D:
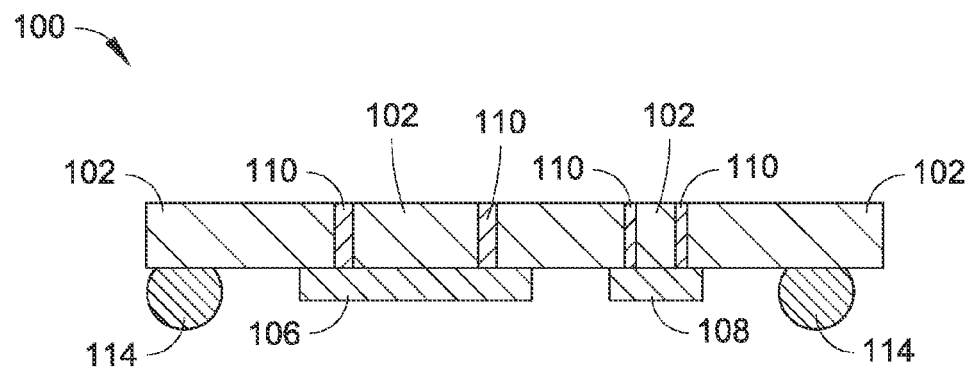
FIG. 1D is a diagrammatic partial cross-sectional side elevation view illustrating a glass-based multichip package in accordance with example implementations of the present disclosure.
Figure 1E:
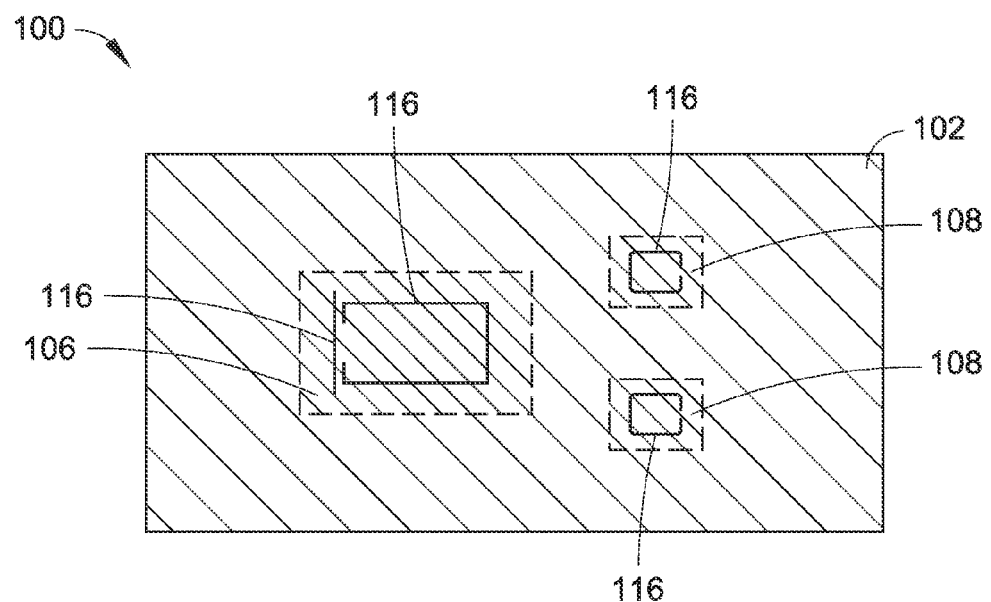
FIG. 1E is a top plan view illustrating a glass-based multichip package in accordance with example implementations of the present disclosure.
Figure 1F:
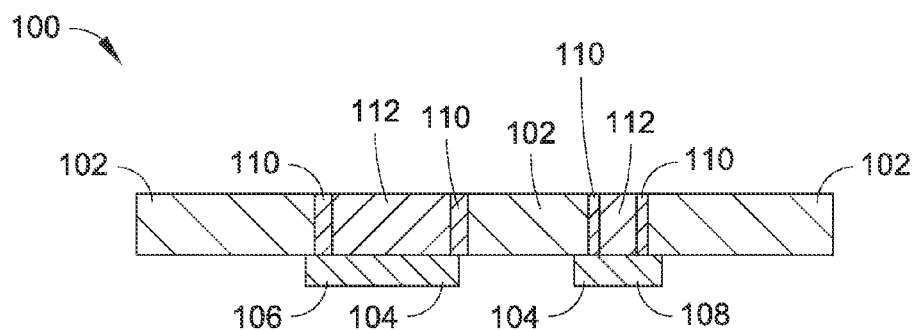
FIG. 1F is a diagrammatic partial cross-sectional side elevation view illustrating a glass-based multichip package in accordance with example implementations of the present disclosure.
Figure 1G:
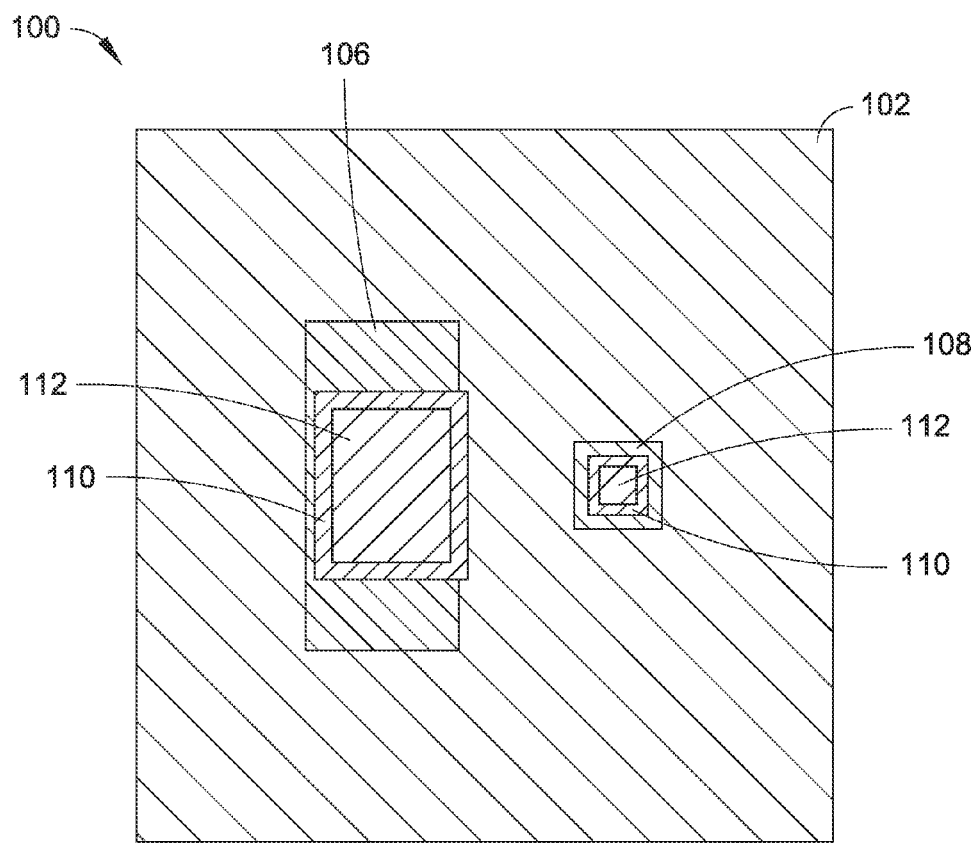
FIG. 1G is a top plan view illustrating a glass-based multichip package in accordance with example implementations of the present disclosure.
Figure 1H:
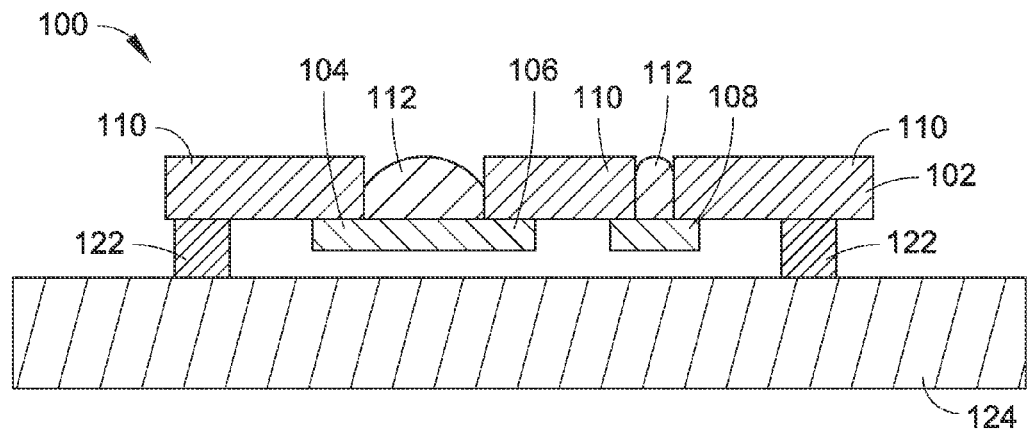
FIG. 1H is a diagrammatic partial cross-sectional side elevation view illustrating a glass-based multichip package in accordance with example implementations of the present disclosure.
Figure 1I:
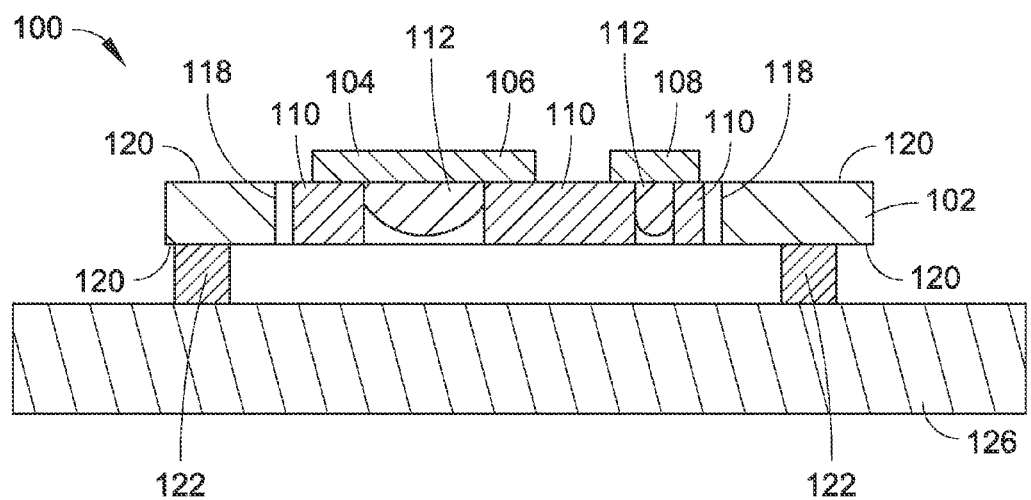
FIG. 1I is a diagrammatic partial cross-sectional side elevation view illustrating a glass-based multichip package in accordance with example implementations of the present disclosure.
Figure 1L:
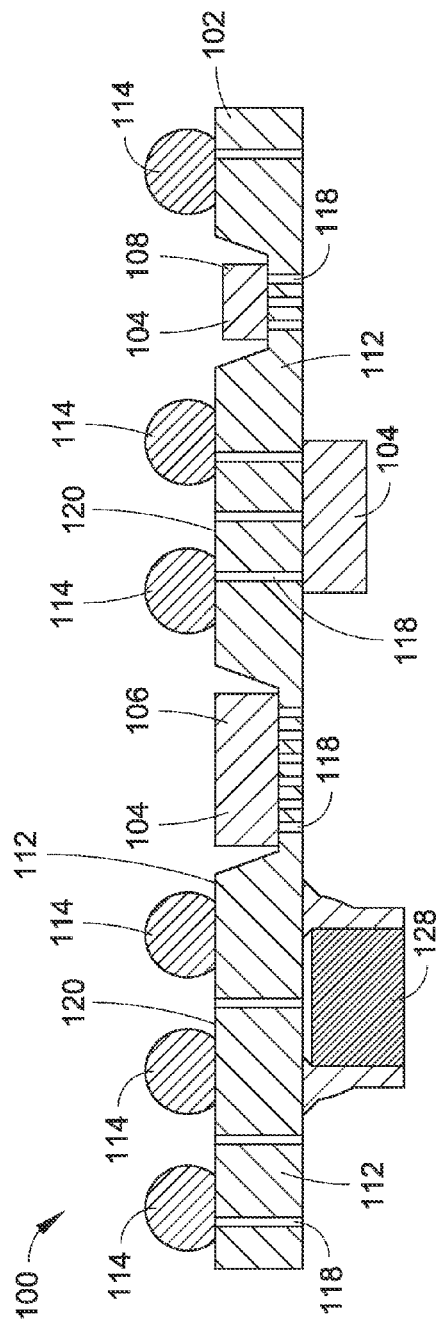
FIG. 1L is a diagrammatic partial cross-sectional side elevation view illustrating a glass-based multichip package in accordance with example implementations of the present disclosure.
Figure 1M:
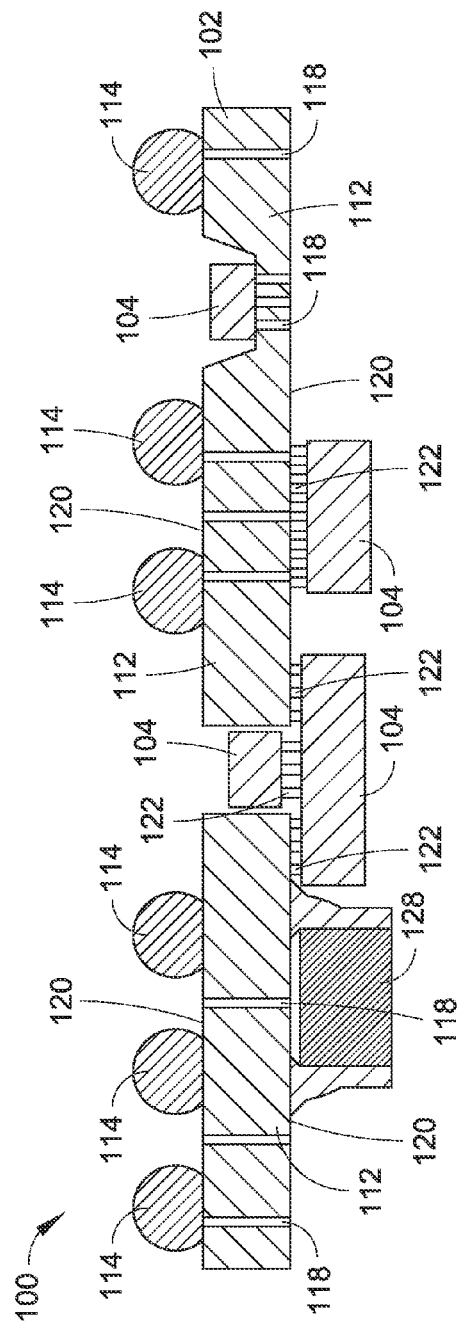
FIG. 1M is a diagrammatic partial cross-sectional side elevation view illustrating a glass-based multichip package in accordance with example implementations of the present disclosure.
Figure 1P:
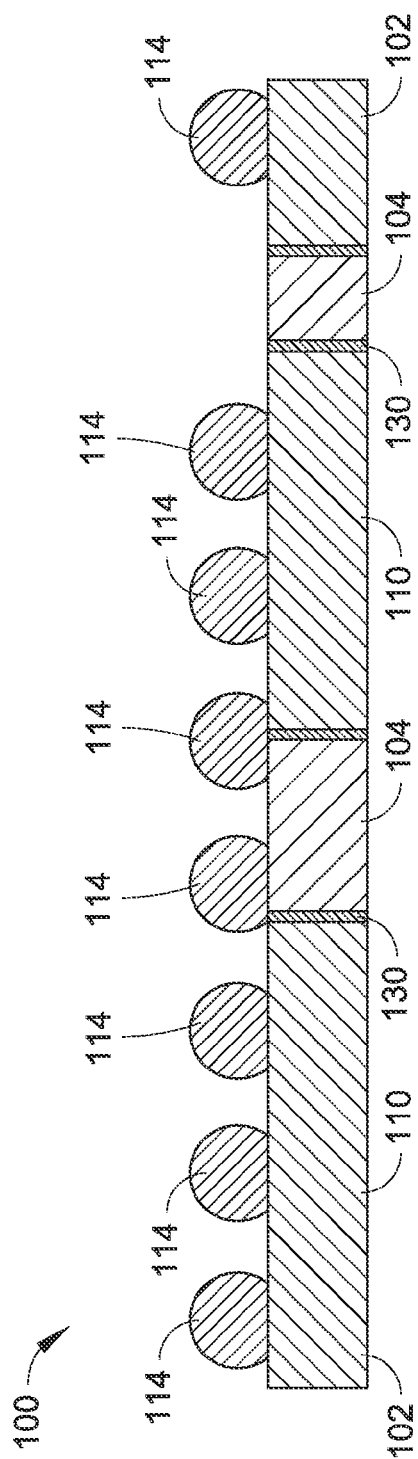
FIG. 1P is a diagrammatic partial cross-sectional side elevation view illustrating a glass-based multichip package in accordance with example implementations of the present disclosure.
Figure 1Q:
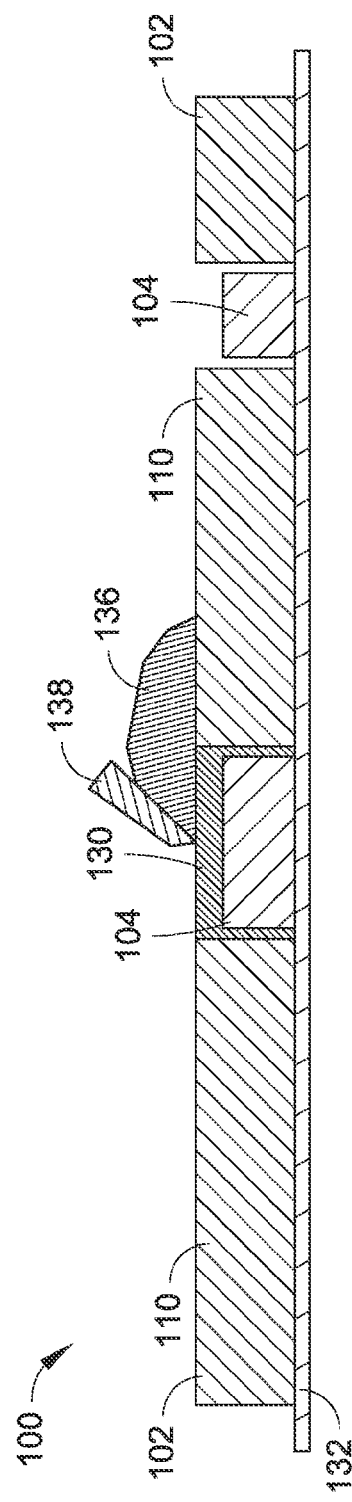
FIG. 1Q is a diagrammatic partial cross-sectional side elevation view illustrating a glass-based multichip package in accordance with example implementations of the present disclosure.

FIGS. 1A through 1Q illustrate a glass-based multichip package 100 in accordance with example implementations of the present disclosure. As shown, the glass-based multichip package 100 includes a glass-based substrate 102.

In implementations, the glass-based substrate 102 includes a photodefinable (photo-structurable) glass. Photodefinable glass can include sensitizers that allow unique anisotropic 3D features to be formed through exposure to ultraviolet (UV) light and subsequent baking and etching of ceramic formed after exposure to the UV light. In an embodiment, the glass-based substrate 102 includes receiving a photodefinable glass substrate where the glass substrate is optically transparent, chemically inert, and thermally stable up to approximately 450° C. Additionally, the glass-based substrate 102 can include a glass with a higher coefficient of thermal expansion than a ceramic state. In an embodiment, the glass-based substrate 102 can be exposed to UV light, baked and converted to ceramic 110, and etched. During the light exposure and etching processes, different features can be formed, such as a lens, a hole (e.g., for forming a through glass via), and/or a cavity in the glass-based substrate 102. In implementations, different portions of the glass-based substrate 102 may be converted to ceramic 110 and may etched or left un-etched. Additionally, the features formed from etching can be filled with other opaque and/or conductive materials. In an embodiment, the glass-based substrate 102 can be converted to a ceramic state and left un-etched, for example, to form a light isolation component.

In implementations, the glass-based multichip package 100 includes at least one electronic component 104. In some embodiments, an electronic component 104 can include an integrated circuit chip with integrated circuits formed therein and/or passive devices (e.g., an inductor, a capacitor, and/or a resistor). In other embodiments, an electronic component 104 can include a sensor device 106, such as an optical sensor (e.g., photodetectors such as phototransistors or photodiodes, and so forth). In some embodiments, the electronic component 104 includes light sources (e.g., a light emitting device 108, such as an LED). Other types of electrical components may also be utilized (e.g., chemical sensors, bio-sensors, combinations thereof, etc.). The electronic component 104 can be disposed on and/or formed within the glass-based substrate 102, such as on the surface or within an etched cavity in the glass-based substrate 102.

In implementations, the glass-based multichip package 100 includes an interconnect 122. An interconnect 122 can include an interconnection configured to provide electrical connectivity between the glass-based substrate 102, the electronic component 104, and/or an external device (e.g., a printed circuit board, a glass touch panel, etc.). In some embodiments, the interconnect 122 includes at least one solder ball 144. Additionally, other types of interconnects 122 can be utilized, such as a redistribution layer, a metal pad, and/or a through-glass via. In such implementations, the glass-based multichip package 100 may be fabricated using multichip scale packaging technologies to facilitate electrical interconnection of the devices.

In some implementations, a redistribution layer 120 is utilized as an electrical interconnection between the electronic components 104 and other components of the glass-based multichip package 100. A redistribution layer 120 can include a thin-film metal (e.g., aluminum, copper, etc.) rerouting and interconnection system that redistributes the conductive layers to a contact pad (e.g., UBM pads) or an area array of solder balls 114 that may be deployed over the surface of the glass-based multichip package 100.

In some implementations, at least one solder ball 114 is formed on the glass-based substrate 102. Solder balls 114 can be formed on the glass-based substrate 102. Solder balls 114 are provided to furnish mechanical and/or electrical interconnection between electrical components 104. In one or more implementations, the solder balls 114 may be fabricated of a lead-free solder such as a Tin-Silver-Copper (Sn—Ag—Cu) alloy solder (i.e., SAC), a Tin-Silver (Sn—Ag) alloy solder, a Tin-Copper (Sn—Cu) alloy solder, and so on.

The glass-based multichip package 100 can also include a through glass via 118 that extends through the glass-based substrate 102 from one surface to a distal surface. The through glass via 118 can include a conductive material that furnishes an electrical interconnection between electrical components (e.g., a redistribution layer). In one or more implementations, the conductive material may include a metal material (e.g., copper, aluminum, etc.).

In one implementation and as shown in FIG. 1A, a glass-based multichip package 100 includes a glass-based substrate 102, at least one optical window 112, at least one solder ball 114, and at least one electronic component 104. In this implementation, the glass-based substrate 102 includes a portion that has been exposed to ultraviolet light and turned to ceramic 110, which is opaque. The portion that has been turned to ceramic 110 may function to block at least a portion of ambient light from reaching a sensor device 106. The portions of the glass-based substrate 102 that are not converted to ceramic 110 can function as an optical window 112. As illustrated in FIG. 1A, the optical window 112 can include a glass window. As illustrated in FIG. 1B, the optical window 112 can be a lens. As shown in FIG. 1A, the electronic components 104 can include a sensor device 106 and a light-emitting device 108 (e.g., an LED) disposed on one side of the glass-based substrate 102 (e.g., the side including solder balls 114). FIG. 1C illustrates a top plan view of a glass-based multichip package 100 showing a glass-based substrate 102 with a sensor device 106 and a light-emitting device 108. In FIG. 1C, the dotted lines represent the boundaries (e.g., edges) of the electronic components 104 (e.g., a sensor, an LED, an integrated circuit chip device) disposed on the bottom side of the glass-based multichip package 100.

In one implementation and as illustrated in FIG. 1D, a glass-based multichip package 100 includes a glass-based substrate 102 with at least one optical window 112, at least one solder ball 114, and at least one electronic component 104 (e.g., sensor device 106 and/or light-emitting device 108). In this implementation, a portion of the glass-based substrate 102 can be laser-drilled to form a slot 116 while the remaining portion is glass. The slot 116 may be filled with an opaque material (e.g., epoxy paste, plated metal, etc.). FIG. 1E illustrates a top plan view of the glass-based multichip package 100 showing the slots 116 filled with an opaque material, which can function as a light isolation component. In FIG. 1E, the dotted lines represent the edges of the electronic components 104 disposed on the bottom side of the glass-based multichip package 100.

In one implementation and as illustrated in FIG. 1F, a glass-based multichip package 100 includes a glass-based substrate 102 with at least one optical window 112, and at least one electronic component 104 (e.g., sensor device 106 and/or light-emitting device 108). In this implementation, a portion of the glass-based substrate 102 proximate to an optical window 112 may be exposed to ultraviolet light and baked to form a portion of ceramic 110. In this implementation, the portion of ceramic 110 surrounds the optical window 112, and the optical window 112 exposes only a portion of the electronic device 104. FIG. 1G illustrates a top plan view of the glass-based multichip package 100 showing the portion of the ceramic 110 that surrounds the optical window 112 that covers a sensor device 106 and/or a light-emitting device 108.

In an implementation and as illustrated in FIG. 1H, a glass-based multichip package 100 includes a glass-based substrate 102 mounted on a printed circuit board 124. In this implementation, the glass-based substrate 102 includes a ceramic 110 portion and an optical window 112 covering a sensor device 106 and a light-emitting device 108. The glass-based substrate 102 can be mounted on the printed circuit board 124 with an electrical interconnect 122, such as an array of solder balls 114. In this implementation, the electronic components 104 may be mounted to the backside of the glass-based substrate 102, and the glass-based substrate 102 may be mounted to a printed circuit board 124 with, for example, the array of solder balls 114. As illustrated in FIG. 1H, the electronic component(s) 104 may be mounted to the backside of the glass-based substrate 102, which in turn may be mounted to the printed circuit board 124. In a similar embodiment and as illustrated in FIG. 1I, a glass-based substrate 102 may be mounted to a glass touch panel 126. In this implementation, the electronic component(s) 104 may be mounted to the glass-based substrate 102 on a side of the glass-based substrate 102 distal from the side mounted to the glass touch panel 126.

In an implementation and as illustrated in FIGS. 1J and 1K, a glass-based multichip package 100 includes a glass-based substrate 102 with at least one cavity etched and/or formed in the glass-based substrate 102. In this implementation, the glass-based substrate 102 may or may not be partially converted to ceramic 110. At least one electronic component 104 may be disposed in a cavity and coupled to the glass-based substrate 102. In the implementation illustrated in FIG. 1J, an electronic component 104 may be encapsulated by an encapsulation material 134. In the implementation illustrated in FIG. 1K, the electronic components 104 are disposed in the cavities formed in the glass-based substrate 102 without an encapsulation material 134, and the glass-based substrate 102 includes at least one through-glass via 118 that electrically couples the electronic components 104 to, for example, a redistribution layer and solder ball 114 array or other interconnects 122.

In an implementation, a glass-based multichip package 100 includes a passive device 128 and a glass-based substrate 102 with at least one electronic component 104 disposed in a cavity formed in a glass-based substrate 102. In this implementation, a sensor device 106 and/or an electronic device 104 (e.g., integrated circuit chip) are disposed in cavities on a solder ball 114 side of the glass-based substrate 102, and a passive device 128 and an electronic device 104 (e.g., integrated circuit chip) are disposed on the surface of the glass-based substrate 102 opposite the solder ball 114 side. The electronic component(s) 104 and/or the passive device(s) 128 may be electrically connected to other electrical device(s) as a portion of the glass-based multichip package 100 by way of at least one through-glass via 118 and/or a redistribution layer 120. In a similar implementation and illustrated in FIG. 1M, a glass-based multichip package 100 includes a passive device 128 and a glass-based substrate 102 with at least one electronic component 104 disposed in a cavity formed in a glass-based substrate 102, and an electronic component 104 (e.g., a flip chip) mounted on the glass-based substrate 102 on the side opposite the solder ball 114 side. A portion of the electronic component 104 may extend into a cavity formed in the glass-based substrate 102, and the cavity may extend completely through the glass-based substrate 102 (e.g., die stacking in an open cavity). FIG. 1N illustrates a similar implementation in which a glass-based multichip package 100 includes similar electronic component 104 stacking (e.g., die stacking) as shown in FIG. 1M except that the cavities containing the electronic components 104 can be filled with an encapsulation material 134 (e.g., an epoxy, etc.). In the implementation shown in FIG. 1N, a solder ball 114 array and/or redistribution layer 120 may be formed at least partially over the encapsulation material 130.

In a further implementation and as shown in FIG. 1P, a glass-based multichip package 100 includes a glass-based substrate 102 in which at least one cavity is formed. In this implementation, an electronic component 104 can be disposed in the cavity and an encapsulation material 130 formed in the cavity and around the electronic component 104. The electronic component 104 may be electrically coupled to a redistribution layer 120 and/or a solder ball 114 array. In some embodiments, the side of the glass-based substrate 102 distal from the side of the glass-based substrate 102 with the solder ball 114 array may be thinned with, for example, a grinding or lapping process.

In an implementation and as illustrated in FIG. 1Q, a glass-based multichip package 100 includes a glass-based substrate 102 in which at least one cavity is formed. At least one electronic component 104 may be disposed in the cavity and on adhesive tape 132. The adhesive tape 132 may be placed on one side of the glass-based substrate 102. An electronic component 104 can then be placed in the cavity and on the adhesive tape 132. The adhesive tape 132 may function to secure the electronic component 104 in place as an encapsulation material 130 (e.g., a screen print epoxy) is placed in the cavity. Other materials and components may be included in this implementation to finalize the glass-based multichip package 100 (e.g., addition of interconnects 122, solder balls 114, additional electronic components 104, etc.).

Example Fabrication Processes

Figure 2:
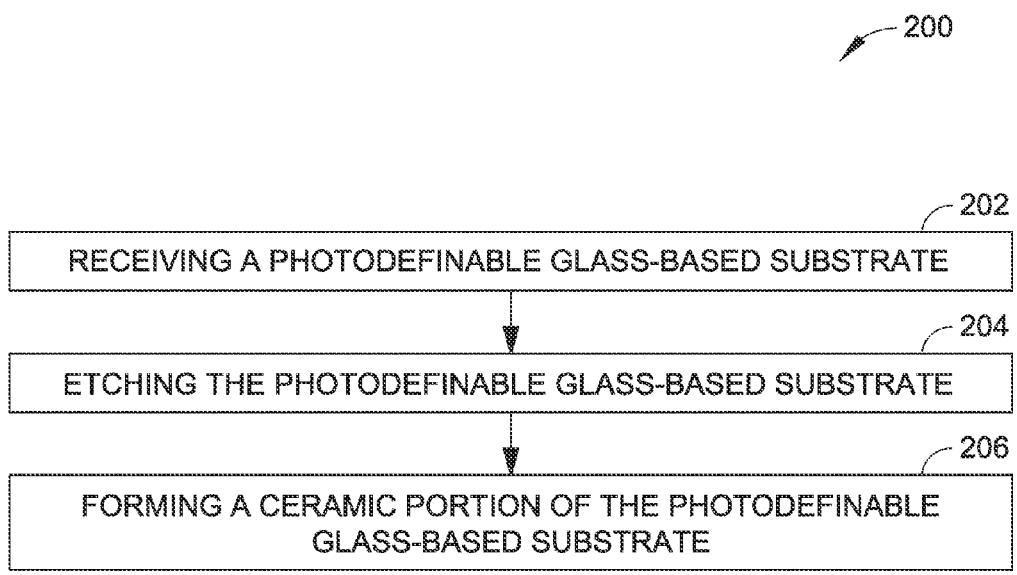
FIG. 2 is a flow diagram illustrating a process in an example implementation for fabricating sensor packages, such as the sensor packages shown in FIGS. 1A through 1Q.

FIG. 2 illustrates an example process 200 that employs sensor packaging techniques to fabricate sensor packages, such as the glass-based multichip package 100 shown in FIGS. 1A through 1Q. FIGS. 3A through 3D illustrate sections of an example glass-based multichip package 300 that are utilized to fabricate multichip devices (such as the glass-based multichip package 100 shown in FIGS. 1A through 1Q).

Figure 3A:
FIGS. 3A through 3D are diagrammatic partial cross-sectional side elevation views illustrating the fabrication of a glass-based multichip package, such as the glass-based multichip package shown in FIGS. 1A through 1Q, in accordance with the process shown in FIG. 2.

As shown in FIG. 2, a photodefinable glass-based substrate is received or formed (Block 202). FIG. 3A illustrates a portion of the glass substrate 302. In implementations, the glass substrate 302 includes a photodefinable (photo-structurable) glass. The photodefinable glass can include sensitizers that allow unique anisotropic 3D features to be formed through exposure to ultraviolet light. In an embodiment, receiving a glass substrate 302 includes receiving a photodefinable glass substrate where the glass substrate is optically transparent, is chemically inert, and is thermally stable up to approximately 450° C.

Figure 3B:
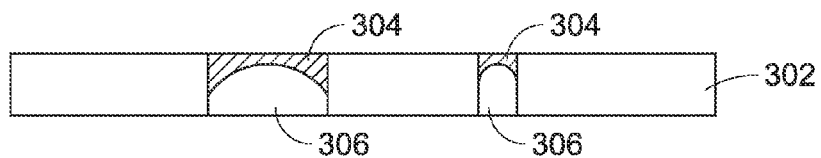

The photodefinable glass-based substrate is etched (Block 204). When exposed to ultraviolet light as shown in FIG. 3B, the photodefinable glass substrate 302 turns to ceramic, which can be etched if desired. In one implementation, the glass substrate 302 is exposed to light from a standard flood ultraviolet light system. In one implementation, exposing the glass substrate 302 includes using a variety of high-energy deep and mid-ultraviolet laser (e.g., with a wavelength of approximately 310 nm). Other types of light may be used to expose the glass substrate 302.

Figure 3C:
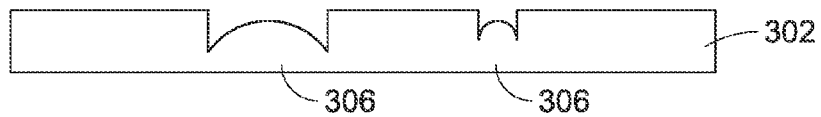
Figure 3D:
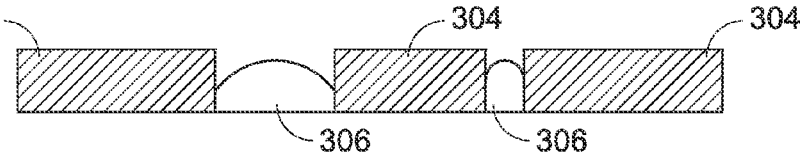

FIG. 3C illustrates a glass substrate 302 of which at least a portion has been exposed to ultraviolet light. In some implementations, a photoresist layer may be applied to the glass substrate 302 for patterning the glass substrate 302. In other implementations, a mask (e.g., a quartz-chrome mask) can be used to project light on the glass substrate 302 in the desired pattern. Subsequent to exposure of the glass substrate 302 to the ultraviolet light, the portion of the glass substrate 302 can be baked to turn the exposed portion to ceramic 304, which may be etched. In an implementation, the glass substrate 302 may be baked at a temperature of approximately 500° C. to allow photo-activators in the glass substrate 302 to migrate together to form nano-clusters. In this implementation, the temperature may be raised to a second temperature to induce ceramic nucleation within the glass matrix proximate to the nano-clusters. Subsequent to the bake, the light exposed regions of the glass substrate 302 convert into a ceramic (e.g., brown or opaque ceramic). In implementations, the ceramic 304 is etched. In an embodiment, etching the ceramic 304 can include etching the ceramic in a hydrofluoric acid (HF) solution in an ultrasonic bath. In implementations, the unexposed portion of the glass substrate 302 is substantially unaffected by the HF etching process. Additionally, other types of etchants and etching processes may be utilized (e.g., plasma etch, etc.). Subsequent to the etching process, an optical window 306 (e.g., a glass window or lens) can be formed, which may be included as a portion of the glass substrate 302, as shown in FIG. 3C. In some implementations, the glass substrate 302 may be etched to form an optical window 306 (e.g., a lens, a window, etc.), a through-glass via, or a slot for filling with other material (e.g., an opaque material, etc.).

At least a portion of the photodefinable glass-based substrate is formed into ceramic (Block 206). In further implementations, portions of the glass substrate 302 may be converted to ceramic (e.g., ceramic portions 304), such as described in the preceding paragraph. In these implementations, the ceramic 304 may not be intended to be further etched, but the ceramic 304 is intended to function as isolation material. In one embodiment, a portion of a glass substrate 302 that has been pre-etched is exposed to ultraviolet light and baked to form ceramic 304, where the ceramic 304 is utilized to function as a light isolator and/or light barrier.

It is contemplated that further semiconductor fabrication techniques may be utilized to finalize the glass-based multichip package 100 fabrication process. For instance, further stripping of photoresist, etching of seed and barrier metals to electrically isolate plated-up lines, and depositing of passivation layers may be incorporated. For example, seed and barrier metal in unplated areas may be removed to form the electrical interconnections.

Figure 4A:
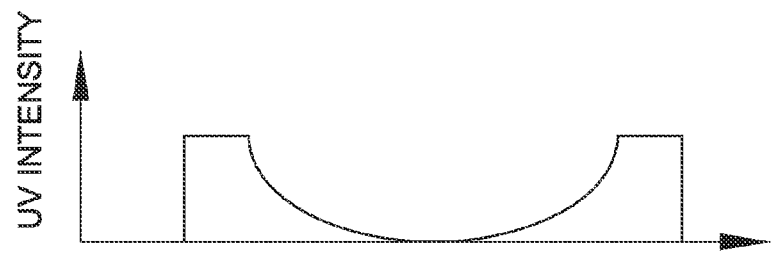
FIGS. 4A through 4D are diagrammatic partial cross-sectional side elevation views illustrating the exposure of a glass-based substrate to ultraviolet light and conversion of a portion of the glass to ceramic.
Figure 4B:
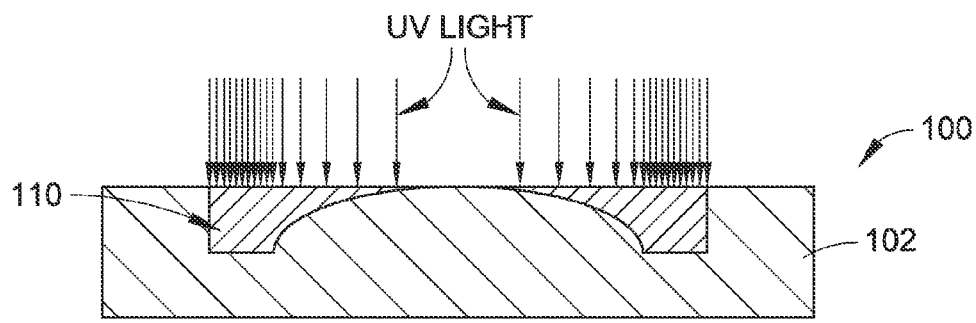
Figure 4C:
Figure 4D:
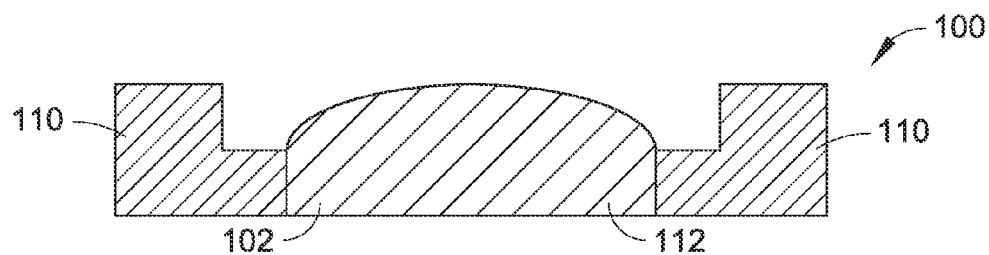

FIG. 4A through 4D illustrates a process exposing a portion of the glass-based substrate 102 to ultraviolet light for converting a portion of the glass-based substrate 102 to ceramic 110. FIG. 4A depicts an example graph of ultraviolet light (UV) intensity versus the position of the glass-based substrate 102. For example, as the ultraviolet light intensity increases (represented by the arrows), a greater (e.g., deeper) portion of the glass-based substrate 102 can be exposed. The portion of the glass-based substrate 102 that is exposed can be converted to ceramic 110 after a bake process, which is discussed above and further illustrated in FIG. 4B. FIG. 4C illustrates a glass-based substrate 102 in which the portion of the glass-based substrate 102 exposed to ultraviolet light and converted to ceramic 110 has been removed using an etching process. FIG. 4D illustrates where a portion of the glass-based substrate 102 has been further exposed to ultraviolet light. The glass-based substrate 102 can then be baked again, and the portion of the glass-based substrate 102 that is converted to ceramic 110 can then function as a light barrier.

Conclusion

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A glass-based multichip package, comprising:
  a photodefinable glass-based substrate, where a portion of the photodefinable glass-based substrate includes a light isolation component that is converted to ceramic;
  at least one electronic component directly disposed on the photodefinable glass-based substrate;
  at least one interconnect including a solder ball directly coupled to the photodefinable glass-based substrate and a printed circuit board, and wherein the electronic component comprises a sensor, the sensor including a light sensor coupled to the photodefinable glass-based substrate and coupled proximate to a lens formed in the photodefinable glass-based substrate, and where light passes through the lens to the light sensor.

2. The glass-based multichip package in claim 1, where the photodefinable glass-based substrate comprises an optically transparent glass-based substrate.

3. The glass-based multichip package in claim 1, where the photodefinable glass-based substrate comprises a thermally stable glass-based substrate.

4. The glass-based multichip package in claim 1, where the electronic component comprises an integrated circuit chip.

5. The glass-based multichip package in claim 1, where the electronic component comprises a light source.

6. The glass-based multichip package in claim 1, further comprising at least one through-glass via.

7. An electronic device, comprising:
a printed circuit board; and
a glass-based multichip package coupled to the printed circuit board, the glass-based multichip package comprising:
   a photodefinable glass-based substrate, where a portion of the photodefinable glass-based substrate includes a light isolation component that is converted to ceramic;
   at least one electronic component directly disposed on the photodefinable glass-based substrate; and
   at least one interconnect including a solder ball coupled to the photodefinable glass-based substrate and the printed circuit board and a printed circuit board, and wherein the electronic component comprises a sensor, the sensor including a light sensor coupled to the photodefinable glass-based substrate and coupled proximate to a lens formed in the photodefinable glass-based substrate, and where light passes through the lens to the light sensor.

8. The electronic device in claim 7, where the photodefinable glass-based substrate comprises an optically transparent glass-based substrate.

9. The electronic device in claim 7, where the photodefinable glass-based substrate comprises a thermally stable glass-based substrate.

10. The electronic device in claim 7, where the electronic component comprises an integrated circuit chip.

11. The electronic device in claim 7, where the electronic component comprises a light source.

12. The electronic device in claim 7, further comprising at least one through-glass via.

* * * * *